(12) United States Patent
Nishida et al.

(10) Patent No.: US 8,258,397 B2
(45) Date of Patent: Sep. 4, 2012

(54) SOLAR CELL AND METHOD OF MANUFACTURING THE SAME

(75) Inventors: Toyozo Nishida, Takaraduka (JP); Natsuyo Sasada, Ikoma (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 607 days.

(21) Appl. No.: 12/204,859

(22) Filed: Sep. 5, 2008

(65) Prior Publication Data

US 2009/0084437 A1    Apr. 2, 2009

(30) Foreign Application Priority Data

Oct. 2, 2007  (JP) .................. 2007-259023

(51) Int. Cl.
*H01L 31/00* (2006.01)
*H01L 21/00* (2006.01)

(52) U.S. Cl. ............. 136/256; 438/64; 438/71; 438/125

(58) Field of Classification Search .............. 427/74; 136/256; 438/57, 64, 71, 125, 126

See application file for complete search history.

(56) References Cited

U.S. PATENT DOCUMENTS

| | | | |
|---|---|---|---|
| 3,903,427 A | * | 9/1975 | Pack .................... 250/208.2 |
| 6,197,611 B1 | * | 3/2001 | Nishimoto .................. 438/57 |
| 2009/0001495 A1 | * | 1/2009 | Weng et al. .................. 257/433 |

FOREIGN PATENT DOCUMENTS

JP         04-223378 A    8/1992

\* cited by examiner

*Primary Examiner* — Jennifer Michener
*Assistant Examiner* — Eli Mekhlin
(74) *Attorney, Agent, or Firm* — Marvin A. Motsenbocker; Mots Law, PLLC

(57) ABSTRACT

Imperfect filling sometimes occurs when a conductive material is filled into a through-hole formed on a solar cell. A method of manufacturing a solar cell of the invention employs a support wherein a conductive material is filled into a through-hole. Accordingly, it is possible to suppress occurrence of imperfect filling and thereby provide a method of manufacturing a solar cell with enhanced reliability. Moreover, a flat surface is provided on a solar cell of the present invention when a connector electrode is formed on a through-hole and this enables enhanced connection reliability.

5 Claims, 6 Drawing Sheets

SOLAR CELL AND METHOD OF MANUFACTURING THE SAME

CROSS REFERENCE TO RELATED APPLICATIONS

This application claims priority based on 35 USC 119 from prior Japanese Patent Application No. P2007-259023 filed on Oct. 2, 2007, the entire contents of which are incorporated herein by reference.

BACKGROUND OF THE INVENTION

1. Field of the Invention

The present invention relates to a solar cell and a method of manufacturing the same.

2. Description of Related Art

As typical in related art, solar cells are known that includes a photoelectric converter having a photoelectric conversion function, a collector electrode and a connector electrode respectively provided on a light receiving surface side and a back surface side of this photoelectric converter. Meanwhile, Japanese Unexamined Patent Application Publication No. Hei 4-223378 discloses solar cells that include a photoelectric converter provided with multiple through-holes and configured to extract carriers collected by a collector electrode on a light receiving surface side via through-hole electrodes formed inside these through-holes, for example.

FIG. 6 is a cross-sectional view for explaining a configuration of a conventional solar cell using a through-hole electrode. In FIG. 6, reference numeral 21 denotes a silicon substrate that has p-type or n-type conductivity. Through-hole 8 penetrating from a light receiving surface side to a back surface side is formed in part of silicon substrate 21. This through-hole 8 is formed by anisotropic etching using an alkaline solution. Through-hole 8 is formed so as to have a large cross-sectional area on the back surface side and a small cross-sectional area on the light receiving surface side.

Diffusion layer 23 is formed in the light receiving surface of silicon substrate 21 and in a wall surface of through-hole 8 by thermal diffusion of an impurity having opposite conductivity to that of silicon substrate 21, and thus forms a p-n junction to constitute photoelectric converter 2. Moreover, insulating film 3 is formed around through-hole 8 on the back surface of silicon substrate 21. This insulating film 3 is provided for electrically insulating through-hole electrode 5 to be described later from silicon substrate 21.

Further, light receiving surface collector electrode 61a is formed on the light receiving surface side of silicon substrate 21. Through-hole electrode 5 is formed, by vapor deposition, on a surface of the p-n junction formed on the wall surface of through-hole 8. This through-hole electrode 5 is formed continuously on insulating film 3 formed around through-hole 8 on the back surface of silicon substrate, on the wall surface of through-hole 8, and on light receiving surface collector electrode 61a. With this configuration, photogenerated carriers collected by light receiving surface collector electrode 61a are extracted from the back surface side via through-hole electrode 5.

Meanwhile, back surface connector electrode 71b is formed, away from through-hole electrode 5, on the back surface of silicon substrate 21.

According to the above-described conventional solar cell, it is possible to extract the photogenerated carriers collected by light receiving surface collector electrode 61a from the back surface side via through-hole electrode 5. Thus, there is no need to provide a connector electrode on the light receiving surface side and, therefore a light receiving area of the solar cell can be increased. Consequently, output can be increased.

In the conventional solar cell, through-hole electrode 5 is formed by vapor deposition. In vapor deposition method, first formation of thick through-hole electrode 5 is difficult. For this reason, in the conventional solar cell including through-hole electrode 5 formed by the vapor deposition method, it is difficult to reduce resistivity of through-hole electrode 5 and is therefore not possible to increase the output efficiently.

Meanwhile, another conceivable approach is to form through-hole electrode 5 by filling a conductive paste into through-hole 8, instead of the vapor deposition method. However, the use of the conductive paste requires thorough filling of conductive paste in the entire through-hole 8. Moreover, the filled conductive paste needs to be retained in the through-hole 8 for a predetermined period of time and to undergo a hardening or baking process. Nevertheless, if the conductive paste has low viscosity, it is impossible to retain the conductive paste inside through-hole 8 for the predetermined period of time. In this case, part of or the entire conductive paste may fall off from through-hole 8.

If part of or the entire conductive paste falls off from through-hole 8 as described above, resistivity of through-hole electrode 5 increases. This reduces output.

On the other hand, if highly viscous conductive paste is used for suppressing this problem, there is a risk that the conductive paste is not filled completely inside through-hole 8 and some space could be created therein. If the conductive paste containing such space undergoes a hardening or baking process, the resistivity of through-hole electrode 5 increases as a consequence or, moisture that enters the space may degrade product reliability. Meanwhile, if the conductive paste falls off from through-hole 8, a gap is generated between through-hole electrode 5 and the connector electrode. That gap may increase contact resistance.

SUMMARY OF THE INVENTION

An aspect of the invention provides a method of manufacturing a solar cell that comprises forming a photoelectric converter which has a relief structure on one principal surface of the photoelectric converter, and which has a plurality of through-holes penetrating from the one principal surface to an opposite principal surface of the photoelectric converter, disposing a support, covering the plurality of through-holes, on the one principal surface, so that the support comes into direct or indirect contact with convex portions in the relief structure, filling a conductive material from the opposite principal surface side into the through-holes and concave portions around each of the through-holes, forming electrodes for a first polarity respectively on the one principal surface and in a portion covering apertures, on the opposite principal surface, of the through-holes, and forming an electrode for a second polarity on any of the one principal surface and the opposite principal surface.

As described above, filling through-holes with conductive material by using the support can prevent part of or the entire conductive material from falling off from the through-holes during or after filling the conductive material.

Preferably, the conductive material should run out of a clearance formed between the one principal surface and the support, and to extend to the one principal surface. On the one principal surface of the photoelectric converter, a surface area of the conductive material on the one principal surface side becomes larger than that of the surface of each aperture. By providing the conductive material as described above, contact resistance can be reduced when providing the electrode having either the first or second polarity.

Preferably the support has a substantially flat surface on the one principal surface side and forms a substantially flat shape on a surface on the one principal surface side of the conductive material so that the shape corresponds to the surface shape of the support. In this way, the through-holes are occluded by the support having the substantially flat surface and the conductive material is thereby filled therein. Therefore, a substantially flat surface is formed on the surface on the support side of the conductive material.

Another aspect of the invention provides a solar cell that comprises a photoelectric converter that has a relief structure on one principal surface of the photoelectric converter, and that has a plurality of through-holes penetrating from the one principal surface to an opposite principal surface of the photoelectric converter, a conductive material filled in the plurality of through-holes, electrodes for a first polarity which are disposed respectively on the one principal surface and the opposite principal surface, and which are electrically connected to the conductive material, and an electrode for a second polarity which is disposed on the one principal surface, and which is electrically insulated from the electrodes for the first polarity. Here, a surface, on the one principal surface side, of the conductive material has a flatter surface than the relief structure of the one principal surface, and one, disposed on the one principal surface, of the electrodes for the first polarity is disposed on the flat surface.

The surface on the one principal surface side of the conductive material preferably has the flat surface that is flatter than the relief structure of the photoelectric converter. This can enhance reliability of connection between the conductive material and the electrode for the first polarity located on the one principal surface.

DETAILED DESCRIPTION OF EMBODIMENTS

Figure 1:
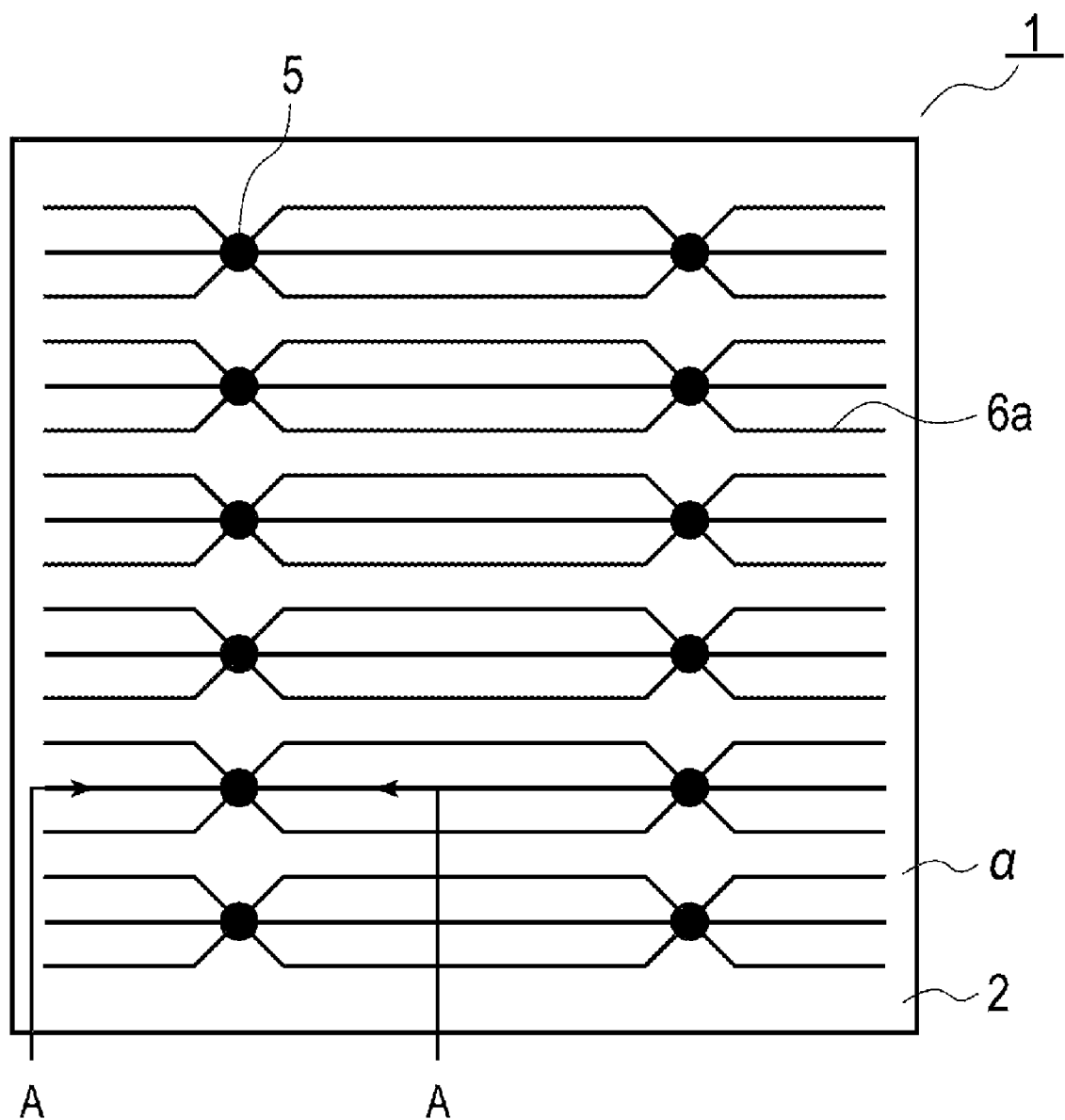
FIG. 1 is a plan view of a first principal surface side of a solar cell formed by a method of manufacturing a solar cell according to an embodiment.

An embodiment of the invention will be described below based on the drawing. The drawing is only an example, and the invention is not limited to proportions of sizes and the like in the drawing. Accordingly, specific sizes and the like have to be judged by considering the following description.

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them.

(Solar Cell)

Solar cell 1 according to an embodiment will be described with reference to FIGS. 1 to 3.

FIG. 1 is a plan view of a first principal surface side of solar cell 1 according to an embodiment. Meanwhile, FIG. 2 is a plan view of a second principal surface side of solar cell 1 according to an embodiment. FIG. 3 is a cross-sectional view taken along an A-A line shown in FIG. 1.

Figure 2:
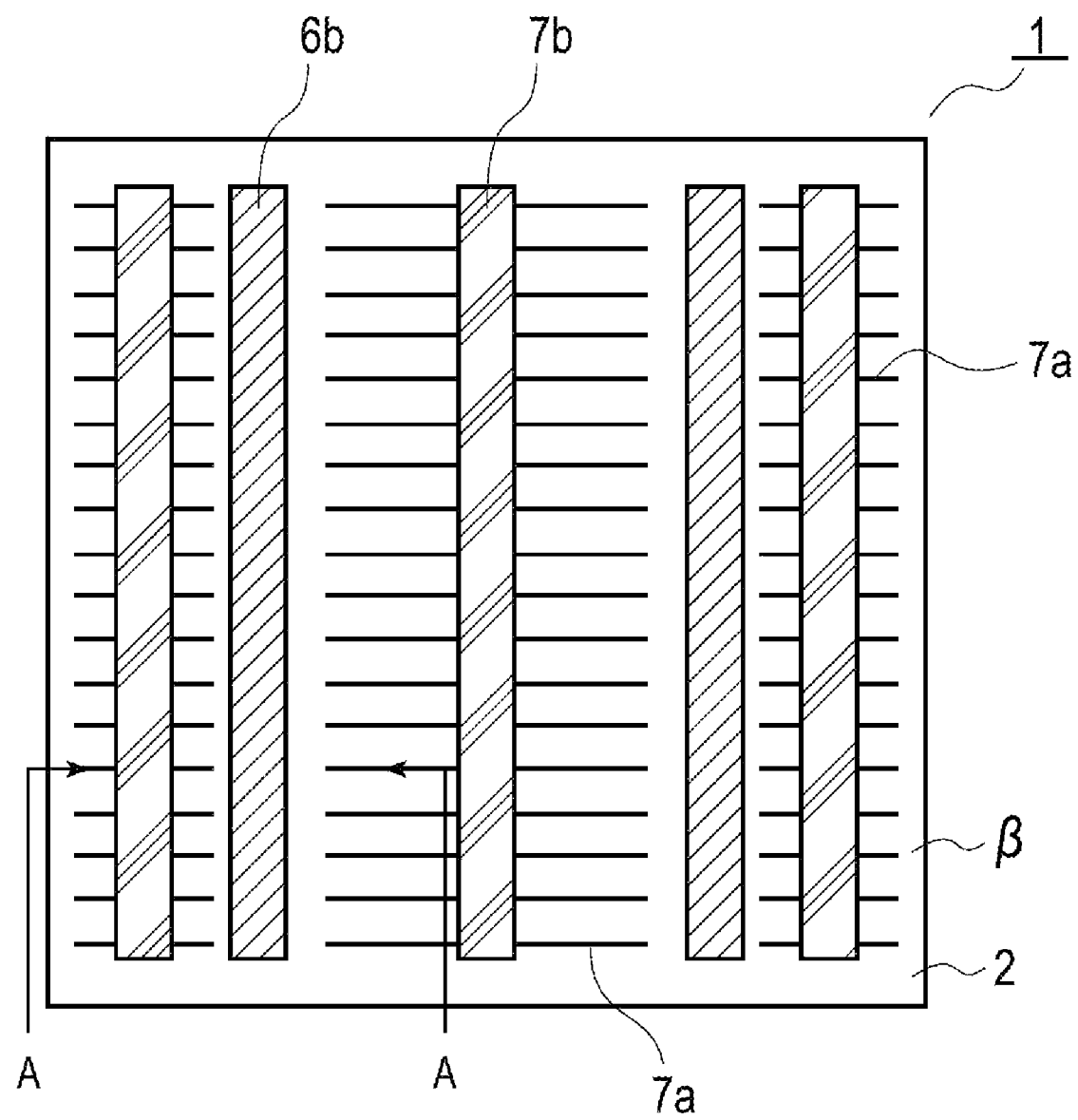
FIG. 2 is a plan view of a second principal surface side of the solar cell formed by the method of manufacturing a solar cell according to an embodiment.

As shown in FIGS. 1 and 2, solar cell 1 includes photoelectric converter 2, first principal surface side collector electrodes 6a, second principal surface side collector electrodes 7a, through-hole electrodes 5, first principal surface connector electrodes 6b, and second principal surface connector electrodes 7b. Photoelectric converter 2 has first principal surface α on which light is made incident and second principal surface β located on the opposite side of the photoelectric converter 2 from the first principal surface α. Incident light to the first principal surface α side of photoelectric converter 2 generates photogenerated carriers. The photogenerated carriers are holes and electrons that are generated from absorption of solar light by photoelectric converter 2.

Photoelectric converter 2 includes semiconductor region 2a of one conductivity type, made of a semiconductor wafer and semiconductor region 2b of an opposite conductivity type, formed on this semiconductor wafer by a thermal diffusion method or a deposition method. Moreover, a texture structure including numerous asperities for effectively using the solar light is formed on the first principal surface side and the second principal surface side of the semiconductor wafer. Here, semiconductor region 2b of the opposite conductivity type formed by the thermal diffusion method or the deposition method after formation of the texture structure includes a principal surface that is substantially parallel to the principal surface of the semiconductor wafer of the one conductivity type. Therefore, the texture structure is also formed on first principal surface α and on second principal surface β. As for the semiconductor wafer, it is possible to use a semiconductor wafer made of a crystalline semiconductor material such as a single-crystal silicon wafer or a polycrystalline silicon wafer, or a semiconductor wafer made of a composite semiconductor material such as GaAs or InP.

First principal surface side collector electrodes 6a are configured to collect photogenerated carriers generated by photoelectric converter 2. As shown in the plan view in FIG. 1, multiple first principal surface side collector electrodes 6a are formed on the entire region of first principal surface α of photoelectric converter 2.

Meanwhile, each of first principal surface side collector electrodes 6a is electrically connected to each of through-hole electrodes 5. The number of first principal surface side collector electrodes 6a electrically connected to each through-hole electrode 5 is not particularly limited. In FIG. 1, three first principal surface side collector electrodes 6a as well as three of them on the left are electrically connected to each through-hole electrode 5. Here, electrically connecting two or more first principal surface side collector electrodes 6a to each through-hole electrode 5 enables reduction of the total number of through-hole electrodes 5. This configuration is preferable because it is possible to reduce an area of an ineffective region occupied by through-hole electrodes 5 and thereby to increase a light receiving area. Moreover, the number and shapes of first principal surface side collector electrodes 6a are appropriately designed in consideration of the size of photoelectric converter 2, and the like.

Figure 3:
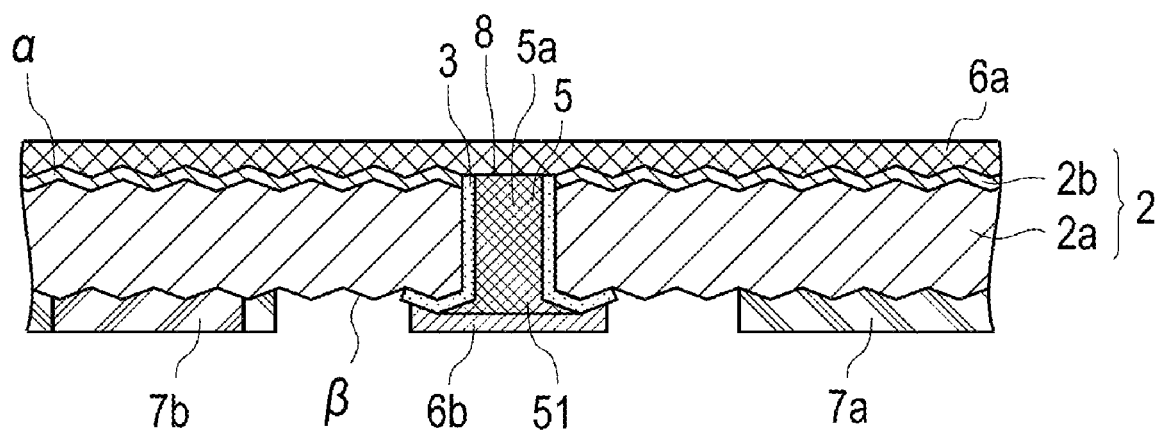
FIG. 3 is an enlarged cross-sectional view of an essential part for explaining respective electrodes located on the solar cell formed by the method of manufacturing a solar cell according to an embodiment.

As shown in the cross-sectional view in FIG. 3, through-holes 8 penetrating from first principal surface α to second principal surface β are formed on photoelectric converter 2. Insulating film 3 is formed on a wall surface of each through-hole 8. This insulating film 3 is formed continuously from the wall surface of through-hole 8 to a region in the vicinity of through-hole 8 on second principal surface β.

Meanwhile, conductive material 5a is filled in through-hole 8, and this conductive material 5a constitutes through-hole electrode 5. As shown in FIG. 3, insulating film 3 is interposed between through-hole electrode 5 and semiconductor region 2a. Accordingly, through-hole electrode 5 is electrically insulated from semiconductor region 2a by insulating film 3. At this time, a surface on the second principal surface β side of through-hole electrode 5 has flat surface 51, which is flatter than the relief structure of the photoelectric converter.

Further, first principal surface side collector electrode 6a is formed so as to cover the surface of through-hole electrode 5 on the first principal surface α side of photoelectric converter 2. Meanwhile, first principal surface connector electrode 6b is formed so as to cover the surface of through-hole electrode 5 on the second principal surface β side of photoelectric converter 2.

With the above-described configuration, the photogenerated carriers collected by first principal surface side collector electrode 6a are guided, through flat surface 51 of through-hole electrode 5, to first principal surface connector electrode 6b located on second principal surface β of the photoelectric converter 2. Moreover, since an interface of contact between through-hole electrode 5 and first principal surface connector electrode 6b is formed into flat surface 51, it is possible to electrically connect first principal surface connector electrode 6b to through-hole electrode 5 over the entire surfaces without causing a gap and thereby reduce contact resistance.

Here, the area and number of through-hole electrodes 5 are appropriately designed in consideration of the number of first principal surface side collector electrodes 6a to be connected to each through-hole electrode 5 and specific resistance of conductive material 5a used therein.

As shown in FIG. 2, second principal surface side collector electrodes 7a are formed on almost the entire region of second principal surface β of photoelectric converter 2, the region excluding the regions where first principal surface connector electrodes 6b are formed. Moreover, second principal surface side collector electrodes 7a are electrically connected to second principal surface connector electrodes 7b.

It is to be noted, however, that the present invention does not limit the shapes and other features of second principal surface side collector electrodes 7a and of second principal surface connector electrodes 7b formed on the second principal surface β of photoelectric converter 2.

(Method of Manufacturing Solar Cell)

Now, a method of manufacturing a solar cell according to this embodiment will be described below with reference to process cross-sectional views in FIGS. 4A to 5D.

Figure 4A:
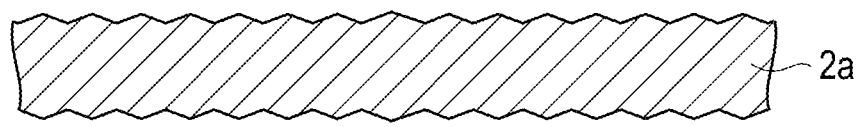
FIGS. 4A to 4D are process cross-sectional views for explaining steps of the method of manufacturing a solar cell according to an embodiment.

First, in a step shown in FIG. 4A, a texture structure is formed on one principal surface and on opposite principal surface of n-type single-crystal silicon substrate 2a by performing anisotropic etching on single-crystal silicon substrate 2a by use of an alkaline solution containing several percent of NaOH or the like. At this time, unevenness is formed at the height ranging from about 0.01 μm to 100 μm and the width ranging from about 0.01 μm to 100 μm, respectively.

Figure 4B:
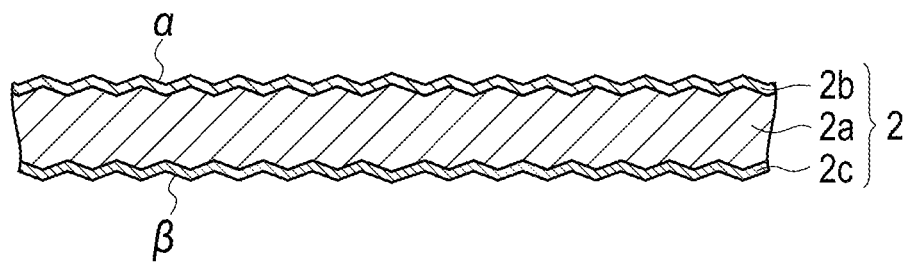

Next, in a step shown in FIG. 4B, first lamination film 2b is formed on the one principal surface of single-crystal silicon substrate 2a by sequentially laminating an i-type amorphous silicon film with a thickness of about 10 nm, a p-type amorphous silicon film with a thickness of about 15 nm, and an ITO (indium tin oxide) film with a thickness of about 700 nm by use of a plasma CVD (chemical vapor deposition) method. Moreover, second lamination film 2c is formed on an opposite principal surface by sequentially laminating an i-type amorphous silicon film with a thickness of about 10 nm, an n-type amorphous silicon film with a thickness of about 20 nm, and an ITO film with a thickness of about 700 nm by use of the plasma CVD method. A p-n junction is formed by first lamination film 2b and single-silicon substrate 2a. Meanwhile, a BSF (back surface field) junction is formed by second lamination film 2c and single-crystal silicon substrate 2a. Photoelectric converter 2 is formed in this step. In this case, the respective amorphous silicon films formed on the one principal surface. The opposite principal surface of single-crystal silicon substrate 2a is formed substantially parallel to single-crystal silicon substrate 2a. Therefore, the texture structure corresponding to the surface shapes of single-crystal silicon substrate 2a is also formed on each surface of first lamination film 2b and second lamination film 2c. Here, the surface of first lamination film 2b formed on the one principal surface side of single-crystal silicon substrate 2a will be referred to as first principal surface α of photoelectric converter 2, while the surface of second lamination film 2c formed on the opposite principal surface side of single-crystal silicon substrate 2a will be referred to as second principal surface β of photoelectric converter 2. In this embodiment, first principal surface α corresponds to the "opposite principal surface" while second principal surface α corresponds to the "one principal surface".

Figure 4C:
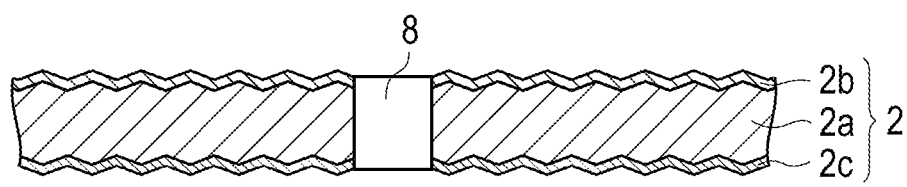

Next, in a step shown in FIG. 4C, multiple through-holes 8 configured to penetrate from first principal surface α to second principal surface β are formed in predetermined positions of photoelectric converter 2. These through-holes 8 can be formed by various methods including a laser processing method, a sand blast method, an etching method, and so forth.

Figure 4D:
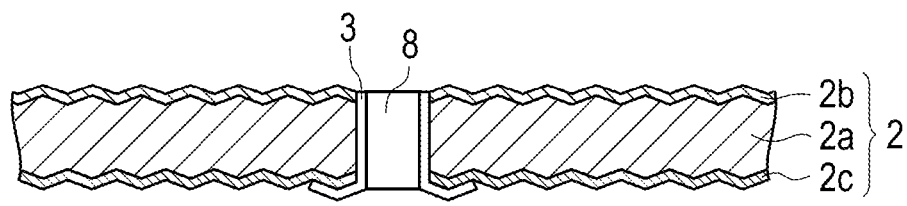

Next, in a step shown in FIG. 4D, insulating film 3 is continuously formed from the region in the vicinity of each through-hole 8 on second principal surface β, extending along the wall surface of through-hole 8 by use of the CVD method. As the material of insulating film 3, it is possible to use metal oxide or nitride, amorphous silicon, or organic materials including epoxy resin, imide or amide resin, polysilazane, and so forth. Moreover, insulating film 3 has a thickness ranging from about 0.1 to 10 μm, and insulating film 3 in the vicinity of an aperture of each through-hole 8 is formed substantially parallel to second principal surface β of photoelectric converter 2. Therefore, insulating film 3 in the vicinity of the aperture of though hole 8 is formed into the texture structure corresponding to the shape of photoelectric converter 2.

Figure 5A:
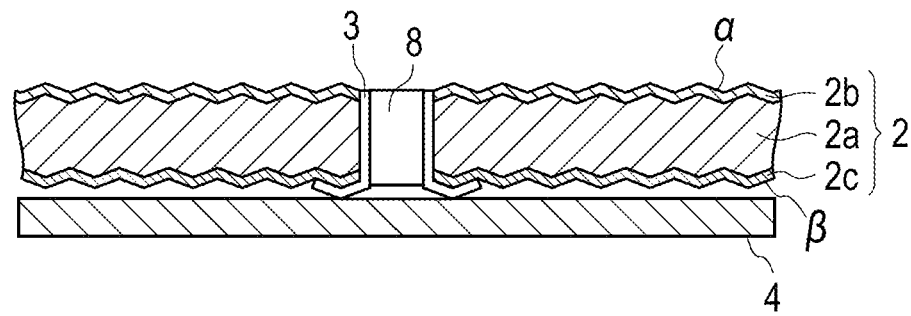
FIGS. 5A to 5D are process cross-sectional views for explaining steps of the method of manufacturing a solar cell according to an embodiment.

Next, in a step as shown in FIG. 5A, support 4 is disposed on second principal surface β so as to cover through-holes 8. At this time, support 4 is disposed so as to contact convex portions of the texture structure formed on second principal surface β or convex portions of the insulating film 3 so that a clearance is provided between support 4 and second principal surface β. This support 4 may be made of silicone resin or fluororesin, for example. Here, the surface of support 4 on the photoelectric converter 2 side has a substantially flat surface having smaller surface unevenness than that of photoelectric converter 2.

Figure 5B:
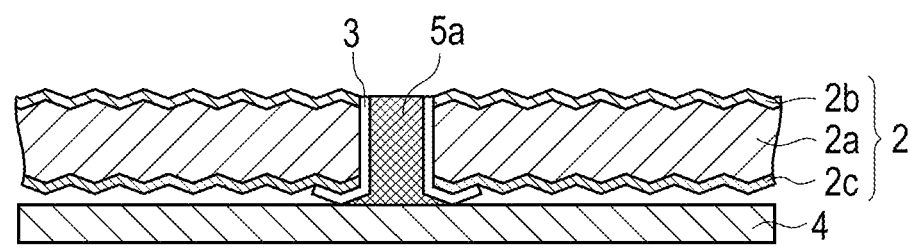

Next, in a step as shown in FIG. 5B, a mask (not illustrated) is deposited on first principal surface α of photoelectric converter 2 and then conductive material 5a is filled in through-holes 8. As conductive material 5a, for example, conductive paste of a thermosetting type or conductive paste of a heat-burning type may be used.

At this time, support 4 is disposed to provide the clearance between itself and second principal surface β of photoelectric converter 2 by utilizing the relief structure of second principal surface β of photoelectric converter 2. Accordingly, conductive material 5a runs out into a space between support 4 and concave portions of insulating film 3 provided in the vicinity of the apertures of through-holes 8 on the second principal surface β side, thereby filling this space. Here, conductive material 5a is filled therein so as not to run out of insulating film 3 provided on second principal surface β of photoelectric converter 2 and not to reach second principal surface β. Therefore, conductive material 5a is disposed on second principal surface β of photoelectric converter 2 and in a region wider than the aperture of each through-hole 8, and within insulating film 3.

Figure 5C:
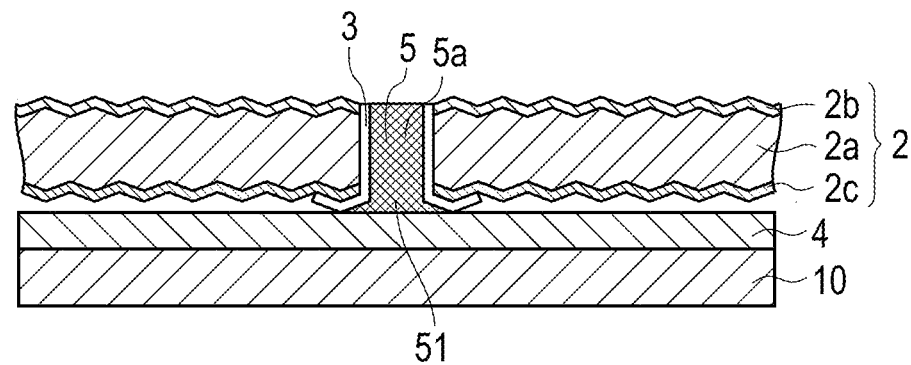

Next, in a step as shown in FIG. 5C, conductive material 5a is subjected to hardening by heat or baking with a heater 10 and is formed into through hold electrodes 5. Subsequently, photoelectric converter 2 is separated from support 4. At this time, conductive material 5a is retained by support 4 until conductive material 5a is hardened. Therefore, conductive material 5a does not fall off from through-holes 8. Moreover, since support 4 has the substantially flat surface, the surface of each through-hole electrodes 5 on the second principal surface side of photoelectric converter 2 is formed into flat surface 51 having a substantially flat shape.

Figure 5D:
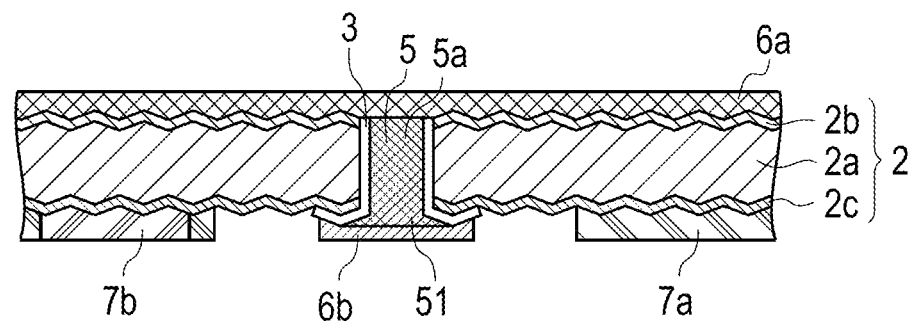
Figure 6:
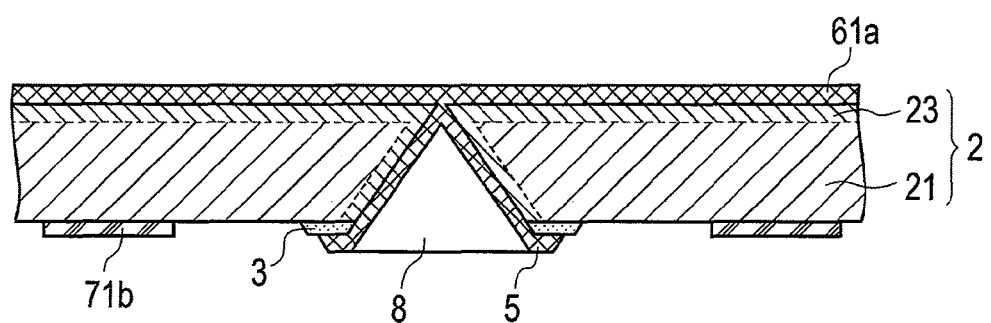
FIG. 6 is a cross-sectional view for explaining a configuration of a solar cell using a through-hole electrode.

Next, in a step as shown in FIG. 5D, electrodes are formed on each first principal surface α and second principal surface α by a printing method or the like. Specifically, first principal surface side collector electrodes 6a are formed on first principal surface α of photoelectric converter 2, while second principal surface side collector electrodes 7a are formed on second principal surface β. Meanwhile, first principal surface connector electrodes 6b to be electrically connected to first principal surface side collector electrodes 6a via through-hole electrodes 5 are formed on second principal surface β of photoelectric converter 2, and second principal surface connector electrodes 7b to be electrically connected to second principal surface side collector electrodes 7a are also formed. First principal surface side collector electrodes 6a, first principal surface connector electrodes 6b, second principal surface side collector electrodes 7a, and second principal surface connector electrodes 7b can be formed by a printing method or the like, such as a screen printing method or an offset printing method, by use of conductive paste of a thermosetting type or a heat-burning type, for example. When first principal surface connector electrodes 6b are formed, since the surfaces of through-hole electrodes 5, on second principal surface β side of photoelectric converter 2, are formed into flat shape, it is possible to establish electrical connection between first principal surface connector electrodes 6b and through-hole electrodes 5 completely on the entire surfaces without generating space, and thereby to reduce contact resistance.

According to the method of manufacturing a solar cell of this embodiment, filling conductive material 5a into through-holes 8 and using support 4 can prevent conductive material 5a from partially or entirely falling off from through-holes 8 during or after the filling. Moreover, since support 4 is separated off after the conductive material 5a is hardened, it is possible to reduce the probability of imperfect filling of conductive material 5a on the support 4 side of through-holes 8. The imperfect filling is caused by adhesion of conductive material 5a to support 4.

Moreover, conductive material 5a is disposed so as to cover the space between support 4 and the concave portion of insulating film 3 provided in the vicinity of the aperture of each through-hole 8 on the second principal surface side. Accordingly, the surface of conductive material 5a on second principal surface β of photoelectric converter 2 becomes larger than the aperture of through-hole 8. By disposing conductive material 5a as described above, it is possible to increase a contact area between through-hole electrode 5 and first principal surface side connector electrode 6b and thereby to reduce electric resistance.

Further, conductive material 5a is filled in while occluding through-holes 8 by use of support 4 having the substantially flat surface. Accordingly, the surface of conductive material 5a is also formed into the substantially flat surface. Therefore, first principal surface connector electrodes 6b to be provided on through-hole electrodes 5 can be formed into the substantially flat shape, whereby it is possible to reduce the probability of imperfect contact with through-hole electrodes 5 at the time of pattern formation for first principal surface connector electrodes 6b.

In other words, in the conventional art, support 4 has not been used at the time of filling conductive material 5a. For this reason, when conductive material 5a is filled from the first principal surface α side, for example, conductive material 5a may droop down to the second principal surface α side due to its own weight and is formed into a convex shape. In this case, the height of such a convex shape becomes greater than that of the texture structure. Accordingly, when first principal surface connector electrodes 6b are formed by printing, the distance between a mask and the surface on the second principal surface β side of through-hole electrode 5 can vary depending on the point on the surface. If the conductive paste is printed in this state, some conductive paste may fall off and the contact area between through-hole electrode 5 and first principal surface connector electrode 6b may be reduced. As a consequence, the contact resistance between through-hole electrode 5 and first principal surface connector electrode 6b may be increased. On the contrary, according to the embodiment, first principal surface connector electrode 6b is formed on flat surface 51 of through-hole electrode 5. Therefore, it is possible to prevent reduction of the contact area between first principal surface connector electrode 6b and through-hole electrode 5 and thereby reduce the contact resistance between first principal surface connector electrode 6b and through-hole electrode 5.

Other Embodiments

Although a textured structure is formed on both sides of single-crystal silicon substrate 2a in the foregoing embodiment, it is also possible to provide the textured structure on either a first principal surface α or a second principal surface β. In this case, support 4 is disposed on the side provided with the texture structure.

In the foregoing embodiment, conductive material 5a is filled into through-hole 8 with support 4 disposed on the second principal surface β side. Instead, conductive material 5a may also be filled into through-hole 8 with support 4 disposed on the first principal surface α side. According to this method of manufacturing solar cell 1, it is also possible to prevent conductive material 5a from partially or entirely falling off from through-hole 8 during or after filling by filling conductive material 5a into through-hole 8 by use of support 4. Moreover, since support 4 is separated off after hardening, it is possible to reduce a probability of imperfect filling of conductive material 5a on support 4 side of through-holes 8. The imperfect filling is caused by adhesion of conductive material 5a to support 4.

Meanwhile, in the foregoing embodiment, the i-type amorphous silicon film and the n-type amorphous silicon film are formed on the second principal surface β of single-crystal silicon substrate 2a. Instead, it is possible to establish the BSF junction by means of thermal diffusion. Moreover, the embodiment does not intend to limit the configuration of photoelectric converter 2. For example, similar effects are achieved by using a polycrystalline silicon substrate instead of the single-crystal silicon substrate.

Moreover, the foregoing embodiment is configured to form through-holes 8 after forming photoelectric converter 2. However, similar effects are achieved by forming photoelectric converter 2 after forming the through-holes 8.

Meanwhile, the foregoing embodiment is configured to hold support 4 by using the convex portions of insulating film 3 formed on photoelectric converter 2. However, similar effects are achieved by holding support 4 with other convex portions on the photoelectric converter 2 and thereby providing a clearance between the region in the vicinity of through-hole 8 and support 4.

Moreover, in the step of filling conductive material 5a into through-holes 8, conductive material 5a may also be filled so as to cover part of photoelectric converter 2 in the vicinity of through-hole 8 in which conductive material 5a is supposed to be filled.

As described above, according to the present embodiment, a solar cell is formed without causing an insufficient filling amount of a conductive material filled in through-holes. In this way, it is possible to provide a solar cell using through-hole electrodes and a method of manufacturing the same, which have improved output performance and product reliability.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A method of manufacturing a solar cell comprising the steps:
   forming a photoelectric converter having a plurality of through-holes penetrating from a principal surface to an opposite surface of the converter;
   disposing a removable support on the principal surface to directly cover the plurality of through-holes and filling the through-holes wherein a clearance is formed between the removable support and the principal surface, with conductive material from the opposite surface, wherein the conductive material runs into the clearance;
   forming through-hole electrodes by hardening or sintering the conductive filling in the through-holes;
   separating off the removable support from the converter;
   forming electrodes for a first polarity on the principal surface and in a portion covering apertures on the opposite surface of the through-holes; and
   forming an electrode for a second polarity on at least one of the principal surface and the opposite surface.

2. The method of claim 1, wherein the step for forming the photoelectric converter includes forming a relief structure having convex and concave portions on the principal surface;
   wherein the step for disposing the removable support on the principal surface includes disposing the removable support so as to contact convex portions of the relief structure directly or indirectly,
   wherein the step for filling the through-holes includes filling concave portions around each of the through-holes with conductive material from the opposite surface.

3. The method of claim 2, wherein the filling step comprises causing the conductive material to run, onto the principal surface, out of a clearance formed between the principal surface and the support.

4. The method of claim 2, wherein the support has a substantially flat surface on the principal surface side, and a substantially flat shape is formed on a surface, on the principal surface side of the conductive material so as to correspond to the surface shape of the support.

5. The method of claim 2, wherein the support contacts convex portions of the relief structure indirectly.

* * * * *